(12) United States Patent
Yoon

(10) Patent No.: US 8,377,801 B2
(45) Date of Patent: *Feb. 19, 2013

(54) NITRIDE SEMICONDUCTOR LIGHT-EMITTING DEVICE AND FABRICATION METHOD THEREOF

(75) Inventor: Ho Sang Yoon, Gwangjoo-si (KR)

(73) Assignee: LG Innotek Co., Ltd., Seoul (KR)

( * ) Notice: Subject to any disclaimer, the term of this patent is extended or adjusted under 35 U.S.C. 154(b) by 451 days.

This patent is subject to a terminal disclaimer.

(21) Appl. No.: 12/697,984

(22) Filed: Feb. 1, 2010

(65) Prior Publication Data

US 2010/0136731 A1 Jun. 3, 2010

Related U.S. Application Data

(63) Continuation of application No. 11/631,858, filed as application No. PCT/KR2005/002206 on Jul. 8, 2005, now Pat. No. 7,674,692.

(30) Foreign Application Priority Data

Jul. 8, 2004 (KR) .................. 10-2004-0052826

(51) Int. Cl.
*H01L 21/322* (2006.01)

(52) U.S. Cl. ..................................... 438/472

(58) Field of Classification Search .................. 438/472
See application file for complete search history.

(56) References Cited

U.S. PATENT DOCUMENTS

| 5,838,029 | A | 11/1998 | Shakuda |
| 5,966,629 | A | 10/1999 | Teraguchi |
| 7,153,760 | B2 * | 12/2006 | Golzarian ............... 438/472 |
| 2002/0004254 | A1 | 1/2002 | Miki et al. |
| 2002/0187568 | A1 | 12/2002 | Stockman |
| 2003/0143770 | A1 | 7/2003 | Takeya |

FOREIGN PATENT DOCUMENTS

| EP | 1 172 867 A2 | 1/2002 |
| EP | 1 255 291 A2 | 11/2002 |
| JP | 10-41544 A | 2/1998 |
| JP | 11-97744 A | 4/1999 |
| JP | 11-329981 A | 11/1999 |
| JP | 11-340511 A | 12/1999 |
| JP | 2000-058919 A | 2/2000 |
| JP | 2000-277802 A | 10/2000 |
| JP | 2001-35796 A | 2/2001 |
| JP | 2002-057161 A | 2/2002 |
| JP | 2003-068745 A | 3/2003 |
| JP | 2004-289031 A | 10/2004 |
| WO | WO 99/13499 A2 | 3/1999 |

OTHER PUBLICATIONS

JP 2001035796 Translation, JP reference submitted by Applicant in Feb. 1, 2010 IDS.*

(Continued)

*Primary Examiner* — Jenny L Wagner
*Assistant Examiner* — Mark Tornow
(74) *Attorney, Agent, or Firm* — Birch, Stewart, Kolasch & Birch, LLP

(57) ABSTRACT

A method of fabricating a nitride semiconductor light-emitting device providing a nitride semiconductor light-emitting device with a GaN layer, bringing the nitride semiconductor light-emitting device into contact with hydrogen separation metal, vibrating the nitride semiconductor light-emitting device and the hydrogen separation metal, removing hydrogen from the GaN layer of the nitride semiconductor light-emitting device and separating the hydrogen separation metal from the nitride semiconductor light-emitting device.

17 Claims, 2 Drawing Sheets

OTHER PUBLICATIONS

S.M. Wang, C.H. Chen, S.J. Chang, Y.K. Su, B.R. Huang, Mg-doped GaN activated with Ni catalysts, Materials Science and Engineering B, vol. 117, Issue 2, Mar. 15, 2005, pp. 107-111, ISSN 0921-5107, DOI: 10.1016/j.mseb.2004.10.024.*

I. Waki, H. Fujioka, M. Oshima, H. Miki, and A. Fukizawa, Low-temperature activation of Mg-doped GaN using Ni films, Appl. Phys. Lett. 78, 2899 (2001), DOI:10.1063/1.1371537.*

Y. Kamii, I. Waki, H. Fujioka, M. Oshima, H. Miki, M. Okuyama, Electrical characteristics of Mg-doped GaN activated with Ni catalysts, Applied Surface Science, vol. 190, Issues 1-4, May 8, 2002, pp. 348-351, ISSN 0169-4332, DOI: 10.1016/S0169-4332(01)00846-7.*

Office Action issued by the Chinese Patent Office on Jul. 1, 2008 in a corresponding Chinese application.

* cited by examiner

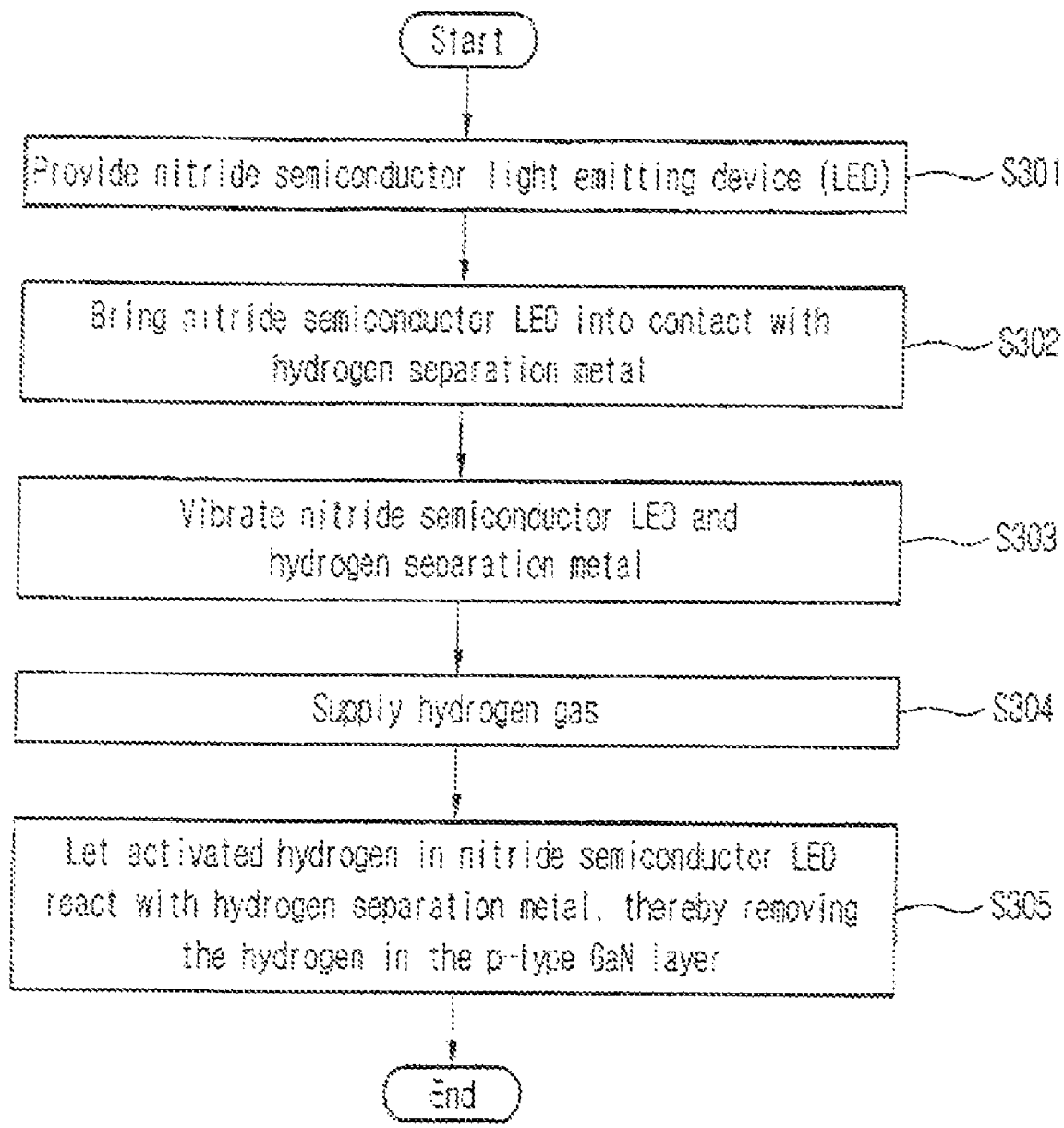

US 8,377,801 B2

NITRIDE SEMICONDUCTOR LIGHT-EMITTING DEVICE AND FABRICATION METHOD THEREOF

CROSS REFERENCE TO RELATED APPLICATIONS

This is a Continuation of U.S. application Ser. No. 11/631,858 filed on Jan. 8, 2007, now U.S. Pat. No. 7,674,692 which is the U.S. National Phase of PCT International Application No. PCT/KR2005/002206 filed on Jul. 8, 2005, on which priority is claimed under 35 U.S.C. §120, and which also claims priority under 35 U.S.C. §119(a) on Patent Application No. 10-2004-0052826 filed in the Republic of Korea on Jul. 8, 2004. The entire contents of each of the above documents is hereby incorporated by reference.

BACKGROUND OF THE INVENTION

1. Field of the Invention

The present invention relates to a nitride semiconductor light-emitting device and a fabrication method thereof.

2. Discussion of the Background Art

A light-emitting diode (LED) is a type of semiconductor device that converts electricity to infrared or visible light using properties of a compound semiconductor and is used as indicator lights in electronic home appliances, remote control devices, electronic display boards, indicators and automation apparatuses.

The operation principle of such an LED is based on energy level of a material. That is, electrons and holes in a material move through and rejoin at a p-n junction when electrically biased in the forward direction. As a result, light is emitted from the p-n junction as energy level of the material is lowered due to the electron-hole rejoin.

Generally, LEDs are manufactured in a very small size about 0.25 $mm^2$ and packaged using a lead frame, a printed circuit board (PCB) and a epoxy molding compound. Recently, the most common package for LEDs is a 5 mm (T 1¾) plastic package, but new packages for LEDs are being developed depending on LEDs application fields. The color emitted by the LEDs depends on the wave length which is controlled by chemical composition of a semiconductor material used.

As components for information technology and telecommunications are getting smaller and slimmer, various kinds of parts thereof, such as resistor, condenser, noise filter and so on, also become much smaller. To keep up such trend, LEDs are manufactured in a surface mount device (SMD) type package so as to be mounted on a PCB directly.

Accordingly, LED lamps used as display devices are being packaged in the SMD type recently. Such SMD-type LEDs can substitute related art simple light lamps and be used as light display apparatus, character display apparatus and image display apparatus for emitting various colored light.

FIG. 1 is a cross-sectional view of an LED in accordance with a related art. With reference to FIG. 1, a method of manufacturing an LED will be described below.

Referring to FIG. 1, a sapphire substrate 10 composed of mainly Al2O3, is provided with a GaN buffer layer 1 made of gallium nitride (GaN) thereon. Then, an undoped GaN layer 3 is formed on the GaN buffer layer 1.

Generally, group three elements in the periodic table are grown on the sapphire substrate 10 by a Metal Organic Chemical Vapor Deposition (MOCVD) method at a growth pressure ranging from 200 to 650 torr to be a layer. That is, the GaN buffer layer 1 and the GaN layer 3 are formed by the MOCVD method.

Next, an n-type GaN layer 5 is formed on the undoped GaN layer 3 using silicon such as monosilane SiH4 or disilane Si2H6.

On the n-type GaN layer 5, an active layer 7 is formed. The active layer 7 serving as a light-emitting area is a semiconductor layer containing Indium Gallium Nitride (InGaN) as light-emitting material therein. After the active layer 7 is grown, a p-type GaN layer 9 is formed on the active layer 7. The p-type GaN layer 9 is formed using Mg-based group two elements in the periodic table.

The p-type GaN layer 9 is complementary layer to the n-type GaN layer 5 which supplies electrons to the active layer 7 when a voltage is applied thereto.

On the contrary, the p-type GaN layer 9 supplied holes to the active layer 7 when a voltage is applied so that the electrons and holes join in the active layer 7 and light is emitted from the active layer 7.

Even though not shown, a transparent metal layer (TM) made of a conductive material (not shown) is formed on the p-type GaN layer 9 to shed the light emitted from the active layer 7 outside.

A light-emitting device manufacturing process is completed as p-type electrode is formed, after the TM layer is formed.

However, the above light-emitting device in accordance with the related art is disadvantageous in that Mg—H complexes having an insulating property is formed on the p-type GaN layer as Mg reacts with atomic H generated from decomposition of NH3 gas when an Mg doping process is performed to form an electrical contact layer on the surface of the p-type GaN layer. The Mg—H complexes serve as an obstacle to the Mg doping, so that it becomes difficult to increase the number of hole carriers in the p-type GaN layer even though Mg is doped at high dose.

Such Mg—H complexes are caused as atomic H combines with Mg contained in trimethyl gallium (TMG) or double cycle pentadienyl magnesium (DCP Mg) organic substance used for crystal growth after the growth of the p-type GaN layer, or caused due to decomposition of NH3 gas which is needed to maintain the p-type GaN layer in NH3 ambient to prevent formation of nitrogen vacancy (N-vacancy) in the p-type GaN layer, wherein such N-vacancy is generated due to the nitrogen out-diffusion upon cooling the p-type GaN layer after its growth. That is, atomic hydrogen is generated when the NH3 gas is thermally decomposed and permeates into the GaN layer through treading dislocation holes existing on the surface of the GaN layer.

DISCLOSURE OF INVENTION

Technical Problem

The present invention is directed to a nitride semiconductor light-emitting device (LED) with a high light efficiency and a method of fabricating the same, wherein a p-type GaN layer in the LED comes into contact with a metal capable of easily forming a metal hydride or a metallic alloy containing such metal after the p-type GaN layer formation to remove H component from Mg—H complexes formed on the surface of the p-type GaN layer.

Technical Solution

To achieve the purposes and advantageous of the present invention, there is provided a nitride semiconductor light-emitting device that includes a substrate, a first GaN layer formed over the substrate, an active layer formed over the first GaN layer, and a second GaN layer formed over the active layer where hydrogen therein is removed at a low temperature.

To achieve the purposes and advantageous of the present invention, there is further provided a method of fabricating a nitride semiconductor light-emitting device. The method comprising: providing a nitride semiconductor light-emitting device with a GaN layer, bringing the nitride semiconductor light-emitting device into contact with hydrogen separation metal, vibrating the nitride semiconductor light-emitting device and the hydrogen separation metal, removing hydrogen from the GaN layer of the nitride semiconductor light-emitting device and separating the hydrogen separation metal from the nitride semiconductor light-emitting device.

Advantageous Effects

The present invention is advantageous in that a p-type GaN layer of a semi-conductor light-emitting device is brought into contact with a metal capable of easily forming a metal hydride at a low temperature in a semiconductor light-emitting device fabrication procedure so that hydrogen existing in the p-type GaN layer is removed, thereby increasing concentration of hole carriers in the p-type GaN layer and light efficiency of a semiconductor light-emitting device.

BRIEF DESCRIPTION OF THE DRAWINGS

FIG. 3 is a flow chart for showing a method of fabricating a light-emitting device in accordance with the present invention.

MODE FOR THE INVENTION

Hereinafter, the present invention will be described in detail by describing preferred embodiments of the present invention with reference to accompanying drawings.

Figure 2:
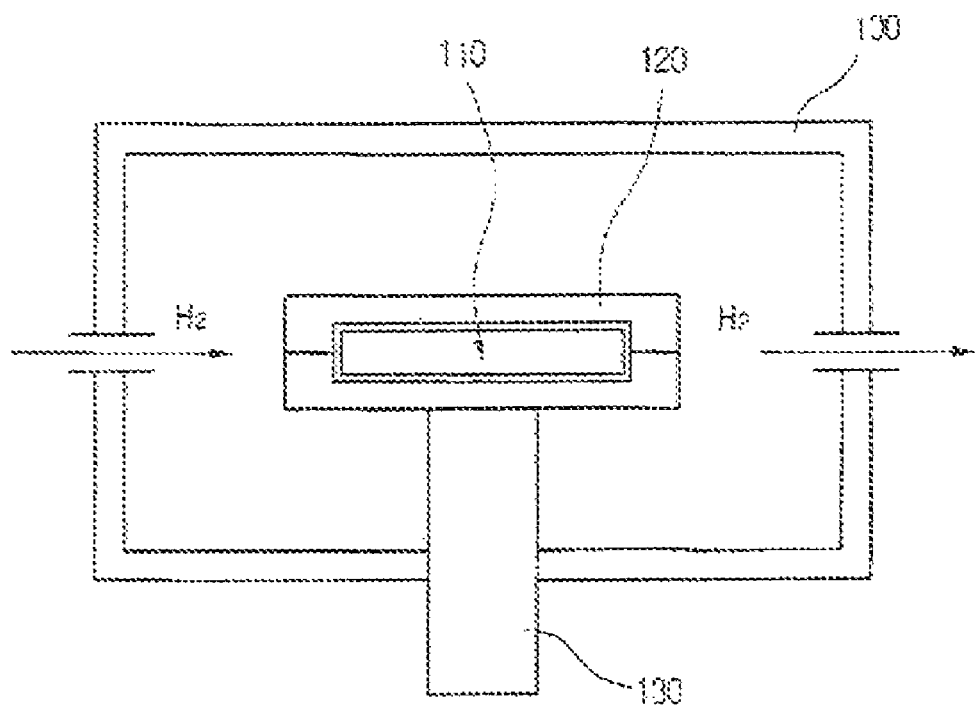
FIG. 2 is a view for explaining a process to remove hydrogen from a light-emitting device in a fabrication method of a light-emitting device in accordance with the present invention.

FIG. 2 illustrates a view for explaining a process to remove hydrogen from a light-emitting device in a light-emitting device fabrication method in accordance with the present invention.

Figure 1:
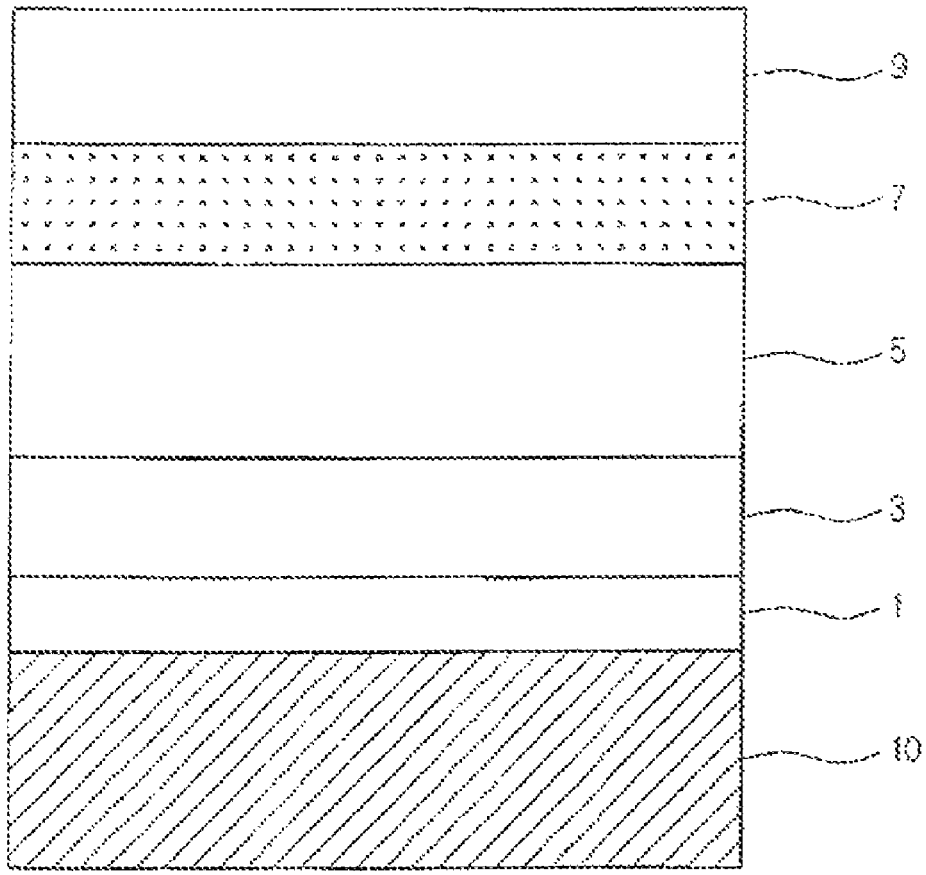
FIG. 1 is a cross-sectional view of a light-emitting device in accordance with a related art.

Referring to FIG. 2, as described with reference to FIG. 1, a buffer layer, a GaN layer, an n-type GaN layer, an active layer and a p-type GaN layer are sequentially provided on a sapphire substrate to form a semiconductor light-emitting device 110, then a process to remove hydrogen in the semiconductor light-emitting device 110 is continued.

For example, the semiconductor light-emitting device is introduced into a chamber 100 and disposed to be in contact with hydrogen separation metal 120. Here, the hydrogen separation metal 120 includes a metal capable of easily forming metal hydride and a metal alloy containing such metal.

In more detail, the hydrogen separation metal 120 includes metals in group II to group V in the periodic table, and binary, ternary or multinary metal alloys composed of the metals in group II to group V and metals in group VI to group VIII in the periodic table, which hardly form a metal hydride.

The hydrogen separation metal 120 surrounds the semiconductor light-emitting device 110 in the chamber 100, thereby coming into contact with the semiconductor light-emitting device 110. In such circumstance, the semiconductor light-emitting device 110 and the hydrogen separation metal 120 are vibrated using an ultrasonic vibration apparatus 130.

In case that the semiconductor light-emitting device 110 and the hydrogen separation metal 120 are vibrated, Mg—H complexes formed on the p-type nitride GaN layer of the semiconductor light-emitting device 110 is activated, so that hydrogen in the Mg—H complexes becomes to a state that it can easily react with the hydrogen separation metal 120.

After the hydrogen is activated by the vibration of the semiconductor light-emitting device 110 using the ultrasonic vibration apparatus 130, hydrogen gas is introduced into the chamber 100 so that the hydrogen separation metal 120 and the activated hydrogen in the Mg—H complexes on the p-type nitride GaN layer easily react.

At this time, reaction between the hydrogen activated in the p-type GaN layer of the semiconductor light-emitting device 110 and the hydrogen separation metal 120 is promoted due to a heat generated by the vibration.

Chemical equation for reaction between the hydrogen in the p-type GaN layer and the hydrogen separation metal 120 in the chamber 100 is expressed as follows:

Chemical Equation 1: Exothermic reaction—hydrogen bond

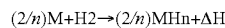

$(2/n)M + H_2 \rightarrow (2/n)MH_n + \Delta H$

Chemical Equation 2: Endothermic reaction—hydrogen separation

$(2/n)MH_n + \Delta H \rightarrow (2/n)M + H_2$

Here, a reaction temperature ranges from 18 to 600° C., and more preferably ranges from 18 to 400° C., and M denotes a metal.

The reaction temperature in the chamber 100 is 400° C. or lower. That is, the reaction is performed at a relatively lower temperature in comparison with the conventional method.

By such reaction, almost the hydrogen in the p-type GaN layer of the semi-conductor light-emitting device 110 is removed as the hydrogen separation metal 120 and the activated hydrogen in the p-type GaN layer react.

In accordance with a related art high temperature process, Mg substituted with Ga or N in the GaN crystal growth layer is easily separated from a bond with adjacent Ga or N due to the high temperature heat treatment, so that hole carriers can freely move. As a result, a contact layer with high hole carrier concentration and low resistance is provided.

Further, before the high temperature heat treatment process, the nitride light-emitting device is placed in an electric furnace or other apparatus, and oxygen O2 gas is introduced into the furnace or the apparatus in a nitrogen N2 ambient, so that reaction between oxygen and hydrogen concentrated on the surface of the p-type GaN layer is induced and thus hydrogen is reduced. By such treatment, thermal decomposition of Mg—H complex with high resistance is promoted.

By such method, Mg activation for p-conductivity doping is promoted and concentration of hole carriers can be higher. However, the related art method has a drawback that O2 introduction to the furnace accompanies danger, process reproducibility is unstable depending on O2 flux, and the device's characteristics are degraded due to the N-vacancy induced due to thermal decomposition of nitride semiconductor.

To solve such problems encountered in the related art method, this invention activates hydrogen on the contact layer by vibration at a low temperature, and then separates the activated hydrogen. Accordingly, such problems are solved by this invention.

In accordance with this invention, since the hydrogen existing in the p-type GaN layer of the semiconductor light-emitting device 110 is removed, there is an advantage that the concentration of hole carriers in the p-type GaN layer is increased, thereby improving low voltage characteristic of the LED device and increasing light efficiency of the LED device.

FIG. 3 is a flow chart for showing a method of fabricating a semiconductor light-emitting device in accordance with the present invention.

Referring to FIG. 3, a buffer layer, a GaN layer, an n-type GaN layer, an active layer and a p-type GaN layer are sequentially formed on a sapphire substrate, thereby forming a nitride semiconductor light-emitting device (S301).

Next, a hydrogen separation process is performed to remove hydrogen existing on and in the p-type GaN layer of the nitride semiconductor light-emitting device. At this time, the nitride semiconductor light-emitting device is moved into a chamber and the device is disposed so as to come into contact with a hydrogen separation metal made of a metal easily capable of forming a metal hydride or its alloy (S302).

The nitride semiconductor light-emitting device is surrounded by the hydrogen separation metal. That is, the exterior of the nitride semiconductor light-emitting device is in contact with the interior of the hydrogen separation metal.

In the chamber, after the nitride semiconductor light-emitting device comes into contact with the hydrogen separation metal, the nitride semiconductor light-emitting device and the hydrogen separation metal are vibrated using an ultrasonic vibration apparatus, so that the Mg—H complexes on the nitride semiconductor light-emitting device are activated (S303).

In more detail, the metal combines with the magnesium Mg doped into the p-type GaN layer of the nitride semiconductor light-emitting device, thereby activating hydrogen which lowers electrical mobility.

After the hydrogen of the nitride semiconductor light-emitting device is activated by the vibration, hydrogen gas is fed into the chamber to promote the reaction between the hydrogen separation metal and the hydrogen (S304).

At this time, the hydrogen activated in the nitride semiconductor light-emitting device reacts with the hydrogen separation metal and forms a metal hydride.

As a result, almost the hydrogen existing in the p-type GaN layer of the nitride semiconductor light-emitting device is removed, the number of hole-carriers increases and electrical conductivity is improved (S305).

As the hydrogen is removed from the p-type GaN layer of the nitride semiconductor light-emitting device, density of hole carriers is increased and driving voltage of the nitride semiconductor light-emitting device is lowered.

Further, as the concentration of hole carriers increases, since the number of hole-electron pairs to join with either becomes greater, light efficiency is improved.

INDUSTRIAL APPLICABILITY

In accordance with the nitride semiconductor light-emitting device and the method of fabricating the same, the number of hole carriers in the p-type GaN layer increases and electrical characteristic of the nitride semiconductor light-emitting device is improved due to removal of hydrogen bonded with Mg in the p-type GaN layer of the nitride semiconductor light-emitting device.

What is claimed is:

1. A method of fabricating a nitride semiconductor light-emitting device, the method comprising:
    preparing a nitride semiconductor light-emitting device including an n-type nitride semiconductor layer, an active layer, and a p-type nitride semiconductor layer, wherein the p-type nitride semiconductor layer includes Mg—H complexes;
    bringing the p-type nitride semiconductor layer into contact with a hydrogen separation metal in a chamber;
    activating the Mg—H complexes;
    supplying hydrogen gas in the chamber after the step of preparing a nitride semiconductor light-emitting device; and
    removing hydrogen from the p-type nitride semiconductor layer,
    wherein a process temperature for removing the hydrogen is lower than 400° C.

2. The method according to claim 1, wherein the hydrogen separation metal comprises a metal selected from group II to group V in the periodic table.

3. The method according to claim 1, further comprising:
    increasing a density of holes in the p-type nitride semiconductor layer as hydrogen is removed.

4. The method according to claim 1, further comprising:
    carrying out a heat treatment to the nitride semiconductor light-emitting device and the hydrogen separation metal.

5. The method according to claim 1, wherein the step of activating the Mg—H complexes comprises:
    vibrating the nitride semiconductor light-emitting device and hydrogen separation metal.

6. The method according to claim 5, wherein the step of activating the Mg—H complexes comprises:
    activating the Mg—H complexes with an ultrasonic vibration apparatus.

7. A method of fabricating a nitride semiconductor light-emitting device, the method comprising:
    preparing a nitride semiconductor layer including an n-type nitride semiconductor layer, an active layer, and a p-type nitride semiconductor layer, wherein the p-type nitride semiconductor layer includes Mg—H complexes;
    forming a hydrogen separation metal on the p-type nitride semiconductor layer in a chamber;
    carrying out a heat treatment to the nitride semiconductor layer and the hydrogen separation metal;
    supplying hydrogen gas in the chamber after the step of forming a hydrogen separation metal on the p-type nitride semiconductor layer; and
    removing hydrogen from the p-type nitride semiconductor layer,
    wherein a process temperature for removing the hydrogen is lower than 400° C.

8. The method according to claim 7, wherein the step of removing hydrogen comprises:
    moving the hydrogen from the p-type nitride semiconductor layer to the hydrogen separation metal.

9. The method according to claim 7, further comprising:
    activating the Mg—H complexes by the heat treatment.

10. The method according to claim 7, wherein the hydrogen separation metal comprises a metal selected from group II to group V in the periodic table.

11. The method according to claim 7, further comprising:
    increasing a density of holes in the p-type nitride semiconductor layer as hydrogen is removed.

12. A method of fabricating a nitride semiconductor light-emitting device, the method comprising:
    preparing a nitride semiconductor layer including an n-type nitride semiconductor layer, an active layer, and a p-type nitride semiconductor layer, wherein the p-type nitride semiconductor layer includes hydrogen;

forming a hydrogen separation metal on the p-type nitride semiconductor layer in a chamber;

activating the hydrogen;

supplying hydrogen gas for promoting the reaction between the hydrogen and the hydrogen separation metal in the chamber after the step of activating the hydrogen; and forming a metal hydride via a reaction between the hydrogen and the hydrogen separation metal, wherein a process temperature for activating the hydrogen is lower than 400° C.

13. The method according to claim 12, wherein the step of activating the hydrogen comprises:

activating the hydrogen with a heat treatment.

14. The method according to claim 12, wherein the step of activating the hydrogen comprises:

vibrating the nitride semiconductor layer and the hydrogen separation metal.

15. The method according to claim 12, wherein the step of forming a metal hydride comprises:

moving the hydrogen from the p-type nitride semiconductor layer to the hydrogen separation metal.

16. The method according to claim 12, the step of forming a hydrogen separation metal on the p-type nitride semiconductor layer comprising:

forming the hydrogen separation metal on a top surface of the p-type nitride semiconductor layer.

17. The method according to claim 12, wherein the p-type nitride semiconductor layer comprises a p-type GaN layer.

* * * * *